US012745354B2

(12) United States Patent
Zeng et al.

(10) Patent No.: US 12,745,354 B2
(45) Date of Patent: Sep. 22, 2026

(54) ELECTRONIC DEVICE WITH PROTECTION STRUCTURE

(71) Applicant: Lenovo (Beijing) Limited, Beijing (CN)

(72) Inventors: Cong Zeng, Beijing (CN); Xiong Li, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 186 days.

(21) Appl. No.: 18/432,945

(22) Filed: Feb. 5, 2024

(65) Prior Publication Data

US 2024/0292551 A1 Aug. 29, 2024

(30) Foreign Application Priority Data

Feb. 28, 2023 (CN) ........................ 202310196052.X

(51) Int. Cl.
*H05K 5/02* (2006.01)
*H04N 23/53* (2023.01)

(52) U.S. Cl.
CPC ........... *H05K 5/0217* (2013.01); *H04N 23/53* (2023.01)

(58) Field of Classification Search
CPC ........ G09F 9/30; G06F 1/1615; H04M 1/026; H04M 1/0264; H04M 1/0266; H05K 5/0217; H04N 23/53
See application file for complete search history.

(56) References Cited

U.S. PATENT DOCUMENTS

2022/0009213 A1* 1/2022 Park ..................... H10K 59/873
2022/0053076 A1* 2/2022 Nguyen Van ....... H04M 1/0264
2022/0279097 A1* 9/2022 Mei ........................ G02B 13/18
2023/0418116 A1* 12/2023 Mochizuki ................ G09F 9/30
2024/0012182 A1* 1/2024 Moon ................ H04M 1/0264

FOREIGN PATENT DOCUMENTS

CN 107231765 A * 10/2017 ........... G06F 1/1684
CN 110120990 A * 8/2019 ............ H04M 1/026

OTHER PUBLICATIONS

Machine Translation of CN197231765A (Year: 2025).*
Machine Translation of CN110120990A (Year: 2025).*

* cited by examiner

*Primary Examiner* — Allen L Parker
*Assistant Examiner* — Peter Krim
(74) *Attorney, Agent, or Firm* — ANOVA LAW GROUP, PLLC

(57) ABSTRACT

An electronic device includes a display output component with a display region; a display protection component; and a through-hole with the display output component and the display protection component arranged along a target direction of the through-hole. The through-hole is used to expose a target component along the target direction.

9 Claims, 3 Drawing Sheets

ELECTRONIC DEVICE WITH PROTECTION STRUCTURE

CROSS-REFERENCE TO RELATED APPLICATION

The present disclosure claims priority to Chinese Patent Application No. 202310196052.X, filed on Feb. 28, 2023, the entire content of which is incorporated herein by reference.

TECHNICAL FIELD

The present application relates to the field of electronic devices, and more particularly, to electronic devices.

BACKGROUND

In an electronic device, a camera is often placed behind a through-hole on the screen. That is, the camera is placed at the through-hole, and the glass cover plate covering the screen often covers both the screen and the camera.

In this scenario, light collection by the camera is affected by the light filtering film of the glass cover plate of the screen, which impacts the function of light sensors on the camera.

SUMMARY

One aspect of the present disclosure provides an electronic device. The electronic device includes a display output component with a display region; a display protection component; and a through-hole with the display output component and the display protection component arranged along a target direction of the through-hole. The through-hole is used to expose a target component along the target direction.

DETAILED DESCRIPTION OF THE EMBODIMENTS

Embodiments of the application disclose an electronic device.

For the purposes of making the objectives, technical solutions, and advantages of the embodiments of the present application clearer, the technical solutions of the embodiments of the present application will be described below with reference to the drawings in relation to the embodiments of the present application. The described embodiments are some but not all embodiments of the present application. All other embodiments, which can be made by one of ordinary skill in the art without undue burden based on the present disclosure, are within the scope of the present disclosure.

Figure 1:
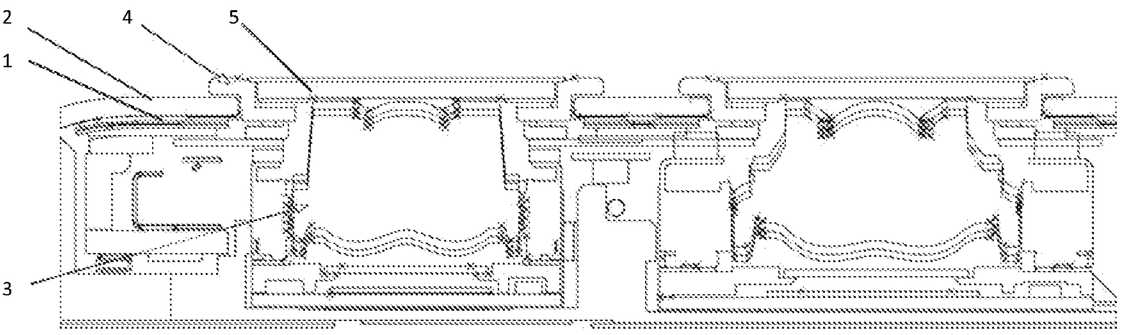
FIG. 1 is a schematic cross-sectional view of an electronic device consistent with an embodiment of the present disclosure.
Figure 2:
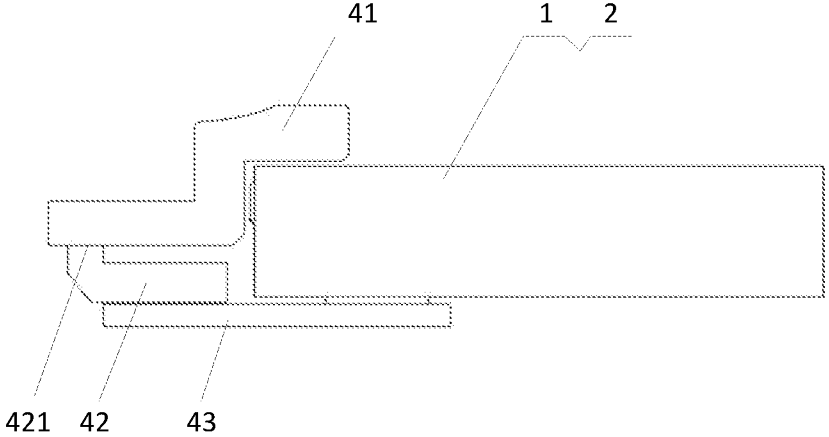
FIG. 2 is a schematic view of a partial cross-sectional structure of an electronic device consistent with an embodiment of the present disclosure.
Figure 3:
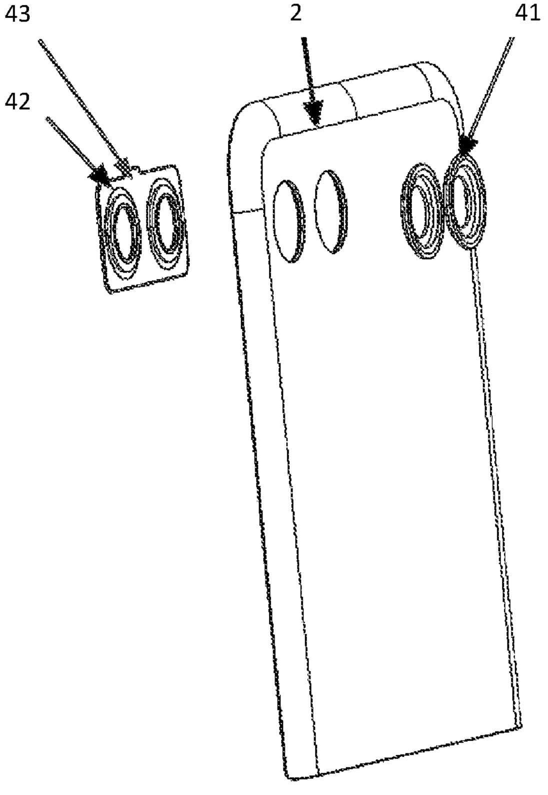
FIG. 3 is an exploded schematic view of an electronic device consistent with an embodiment of the present disclosure.

Referring to FIG. 1, FIG. 2, and FIG. 3, an electronic device consistent with an embodiment of the present disclosure includes a display output component 1, a display protection component 2, and a through-hole. The display output component 1 includes a display area. The display output component 1 and the display protection component 2 are placed along the target direction of the through-hole. The through-hole is used to expose the target component 3 along the target direction.

According to the electronic device provided by embodiments consistent with the present disclosure, the display output component 1 and the display protection component 2 are placed along the target direction of the through-hole, so that the target component 3 can be exposed along the target direction through the through-hole. As such, the display output component 1 and the display protection component 2 do not block the target component 3, which enables the input (such as lighting) on the target component 3 to be conveniently and independently adjusted. The display output component 1 and the target component 3 can thus operate relatively independently, which improves the performance of the electronic device.

In one embodiment, target component 3 may be a camera. Since the display output component 1 and the display protection component 2 are placed along the target direction of the through-hole, the through-hole exposes the target component 3 in the target direction. As such, the lighting effect, such as light exposure, of the target component 3 can be independently adjusted, and does not need to be influenced by the display output component 1 and the display protection component 2. The display protection component 2 is a transparent member, such as glass or the like, covering the screen.

Display protection component 2 is a component for protecting the display output component 1. In some embodiments, display protection component 2 covers the display output component 1 at least partially or completely.

In order to implement the function of the display protection component 2 and to maintain the formation of the through-holes, the display output component 1 may include a first hole; the display protection component 2 may include a second hole; the first hole corresponds to the second hole; the through-hole may be composed of the first hole and the second hole. That is, a hole forming operation is performed through the display output component 1 and the display protection component 2 so that the first hole is formed in the display output component 1 and the second hole is formed in the display protection component 2. After the display output component 1 and the display protection component 2 are assembled, the first hole of the display output component 1 corresponds to (e.g., aligned with) the second hole of the display protection component 2, so that the first hole and the second hole form the through-hole. In some embodiments, a number of the first holes and the second holes are aligned along the extending direction, which is the target direction, of the through-holes. The through-hole is used to expose the target component 3 in the target direction, and the target component 3 may be placed in the through-hole, or may be provided on one side of the through-hole and be exposed through the other side of the through-hole.

In embodiments of the present disclosure, other structures may also be provided. For example, the display output component 1 may include a notch structure, the display protection component 2 may include an opening, a projection area of the opening to the display output component 1 is located in the notch structure, and display protection component 2 may include a portion covering the notch structure, which is outside the opening. This requires that the through-hole corresponds to (e.g., aligned with) the opening of the display protection component 2.

Further, in the first embodiment, the electronic device includes a first protection member 4 having a conductive property. The first protection member 4 may be disposed in the through-hole. The first protection member 4 protects at least one of: a display output component 1 and a target component 3. That is, the first protection member 4 has a conductive property, and can protect the display output component 1 and/or the target component 3 by the conductive property (e.g., electrostatic discharge).

In particular, the display output component 1 and/or the target component 3 may be protected by a grounding operation. For example, in an electronic device, the first protection member 4 can enable the display output component 1 and/or the target component 3 to be electrically connected to a ground component in the electronic device, which may be a middle frame or a main board in the electronic device.

As shown in FIG. 2, the first protection member 4 includes a first sub-member, a second sub-member and a protruding structure 421. The first sub-member includes a first surface, the second sub-member includes a second surface, and the second surface corresponds to the first surface. Protruding structure 421 includes at least one of a first surface and a second surface. That is, the first protection member 4 is composed of at least two split sub-members (first sub-member, second sub-member), and during the assembling process, the first protection member 4 with respect to the through-hole formed on the display output component 1 and the display protection component 2 can be assembled more conveniently. Further, the conductive connection or conductive contact of the first protection member 4 to the display output component 1 and/or the target component 3 is also implemented, thereby realizing the protection to the display output component 1 and/or the target component 3.

In embodiments consistent with the present disclosure, the protruding structure 421 can implement the tip discharge function.

As shown in FIG. 2, the first sub-member may comprise a first part 41 and the second sub-member may comprise a second part 42 and an assembly piece 43. During the assembling process, the second part 42 and the assembly piece 43 are electrically connected, and the assembly piece 43 is connected to the side of the display output component 1 facing away from the display protection component 2, so that the second part 42 and the assembly piece 43 are placed at one side of the display output component 1 (from bottom to top in FIG. 2); the first part 41 is then mounted from the other lateral side of the display output component 1 (e.g. in the top-down direction in FIG. 2). The protruding structure 421 is located on the second part 42, and the protruding structure 421 is in contact with the first part 41 or has a spacing capable of conducting electricity, so that the tip discharge of the contact surface can be realized.

For example, the protruding structure 421 is in contact with the second part 42, and then the distance between the protruding structure 421 and the first part 41 is set to be 0 (the tolerance is approximately 0.02 mm). During the electrostatic discharge process, electrons are discharged to the second part 42 through the tip of the first part 41 and then conducted to the ground member of the electronic device through the assembly piece 43, thereby protecting the display output component 1 and the target component 3.

Further, the tip discharge surface of the protruding structure 421 is a non-planar structure such as a corrugated surface. In some embodiments, laser engraving and/or solar pattern increasing may be applied on the tip discharge surface of the protruding structure 421. In connecting the protruding structure 421 to the first part 41, a structural or conductive adhesive may be used for connection. By the above arrangement, the adhesive solution between the protruding structure 421 and the first part 41 can enter a concave structure (such as a groove) of the non-planar structure to ensure that the protruding structure 421 is in effective contact with the first part 41. Such a structure ensures the conductive properties between the protruding structures 421 and the first part 41 and functions as a barrier to the adhesive solution. This improves the bonding firmness and enables the grounding function of these components.

Figure 4:
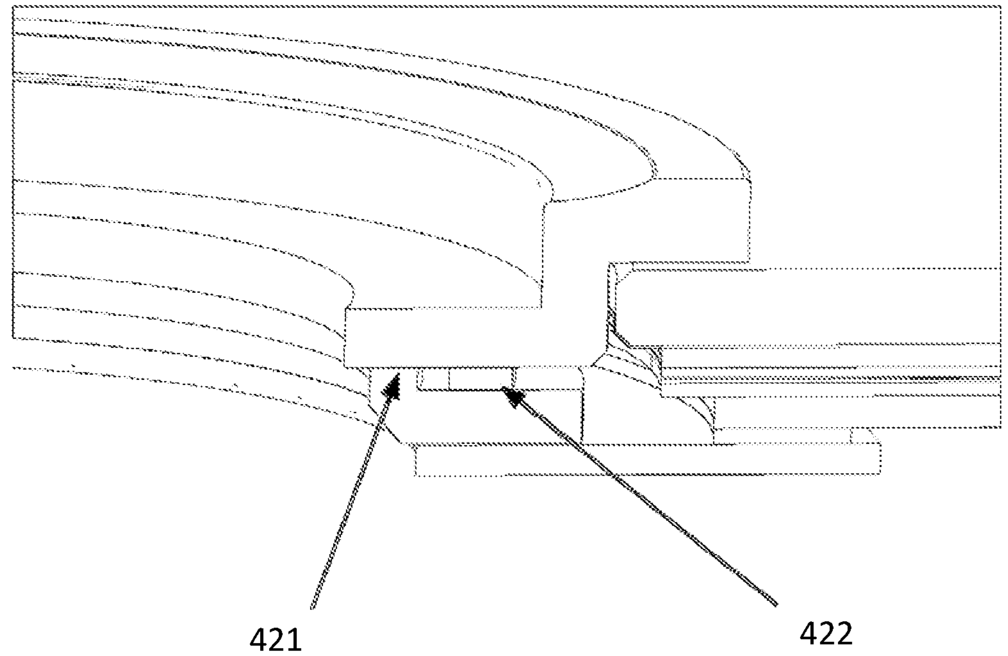
FIG. 4 is a partial schematic view of a second part consistent with an embodiment of the present disclosure.

As shown in FIGS. 2 and 4, the second part 42 has an annular structure, and the protruding structure 421 has an annular shape. Also, the protruding structure 421 is located on the side of the second part 42 close to the target component 3 (camera) in order to enhance the conductive effect.

The side of the second part 42 facing the first part 41 is further provided with a dispensing surface 422. The protruding structure 421 is located at a side of the dispensing surface 422 close to the target component 3 (camera), and the protruding structure 421 protrudes from the dispensing surface 422. When the protruding structure 421 contacts the first part 41, a certain distance exists between the dispensing surface 422 and the first part 41. The adhesive solution is used to fill in the gap of that distance. Because the protruding structure 421 and the first part 41 are conductive, there is no further conductive requirement for the adhesive between the dispensing surface 422 and the first part 41, as such, a structural adhesive with higher bonding strength can be used to connect the dispensing surface 422 and the first part 41, thereby improving the connection stability between the second part 42 and the first part 41.

In some embodiments, the dispensing surface 422 is an annular surface, and the protruding structures 421 and the dispensing surface 422 are arranged along the radial direction of the through-hole.

The first protection member 4 may also be an integral structure. For example, first protection member 4 may be made of a conductive material such as metal, as a flat piece connection component or a wire connection component, thereby realizing the operation of conductively connecting the display output component 1 and/or the target component 3 to a ground member of the device.

In a second embodiment, the electronic device further includes a second protection member (e.g., protection member 4). The second protection member is disposed in the through-hole, and the second protection member is configured to change a stress direction by its structural shape to protect at least one of: a display output component 1 and a target component 3. That is, the second protection member is able to change the direction of the force. When the electronic device and an external object generate impact, such as when the electronic device falling onto the ground, the second protection member makes contact to the external object before other components, and the stress direction is changed through the structural shape (such as elastic deformation or impact force decomposition) of the second protection member, so that the impact force is reduced or prevented from being directly transmitted to the display output component 1 and/or the target component 3. Thus, the display output component 1 and/or the target component 3 are effectively protected.

The structural shape of the second protection member can be set according to different requirements as long as the stress direction can be changed so that the impact force is reduced or prevented from being directly transmitted to the display output component 1 and/or the target component 3.

The second protection member may include at least an annular member, which is located behind the display protection component 2 in the target direction. i.e., the annular member is located on the side of the display protection component 2 facing away from the display output component 1. Because of its position and structure, the annular member contacts the external object before the display protection component 2 upon a collision of the electronic device with an external object.

In some embodiments, the annular direction of the annular member is the circumferential direction of the through-hole.

As shown in FIG. 2, in the present embodiment, the second protection member may also include the first part 41, a second part 42, and an assembly piece 43, and the first part 41 includes an annular member.

Further, the second protection member comprises at least an annular member and an assembly member, the annular member being located behind the protection member 2 along the target direction; the assembly member is located in front of the display output component 1 along the target direction, and the annular member and the assembly member serve to constrain the display output component 1 and the display protection component 2 along the target direction. That is, the annular member and the assembly member are located on both sides of the display output component 1 and the display protection component 2, respectively, so that the display output component 1 and the display protection component 2 are sandwiched by the annular member and the assembly member. During assembly, the annular member and the assembly member serve to constrain the display output component 1 and the display protection component 2 in the target direction, providing effective protection of the display output component 1 and the display protection component 2.

During assembly, the annular member is located on the side of the display protection component 2 facing away from the display output component 1, and the assembly member is located on the side of the display output component 1 facing away from the display protection component 2. In some embodiments, the assembly member may be the assembly piece 43. In some embodiments, the assembly piece 43 may include the assembly member. During the assembling process, the annular member of the first part 41 is in contact with the display protection component 2 and the first part 41 can be connected to assembly piece 43 with an assembly member such that the relative position of the annular member and the assembly member is fixed, fixing the display output component 1 and the display protection component 2 along the target direction. Accordingly, the second protection member makes it more convenient to assemble the electronic device.

As shown in FIG. 2, in the third embodiment, the electronic device includes a third protection member (e.g., protection member 4) having conductive property and a structural shape, the third protection member being disposed in the through-hole, the third protection member protects at least one of: a display output component 1 and a target component 3.

That is, the third protection member is conductive, and its structural shape also plays a protective role. In the present embodiment, the grounding operation of the display output component 1 and/or the target component 3 can be realized by the third protection member, and the structural protection of the display output component 1 and/or the target component 3 can also be realized.

In some embodiments, the third protection member includes a first part 41 and a second part 42 (also referred as second connecting part 42), the first part 41 includes an annular member and a first connecting member, one end of the first connecting member is connected to the annular member after the annular member is positioned behind the display protection component 2 in the target direction, and the other end of the first connecting member extends into the through-hole. The second part comprises an assembly piece 43 and a second connecting part 42. The assembly piece 43 is located in front of the display output component 1 in the target direction, i.e. such that the assembly piece 43 is located on the side of the display output component 1 facing away from the display protection component 2. One end of the second connecting part 42 is connected to the assembly piece 43, the other end of the second connecting part 42 extends into the through-hole, and the first connecting member is in contact with the second connecting part 42.

For ease of assembling, in the present embodiment, the annular member and the first connecting member may be formed in an integral structure, forming a stepped structure to achieve a structure in which the annular member is partially in contact with the display protection component 2, ensuring that the first part 41 fixes the position of the display output component 1 and/or the target component 3. The assembly part 43 and the second connecting part 42 are separate pieces, and the assembly part 43 and the second connecting part 42 are connected by gluing or welding, so that the integral processing of the second part is realized.

As shown in FIG. 1, the electronic device further comprises an image acquisition device and a protection component 5 of the image acquisition device. The image acquisition device is placed in the through-hole, and image acquisition device may be target component 3. The coating of the protection component 5 of the image acquisition device is different from the coating of the display protection component 2 of the display output component 1. That is, the coating film of the protection component 5 of the image acquisition device and the display protection component 2 of the display output component 1 are two independent components, and the two components do not affect each other. The display protection component 2 of the display output component 1 is a component for protecting the display output component 1, and the coating film of the display protection component 2 of the display output component 1 is adjusted according to the display requirement of the display output component 1. That is, the coating film of the display protection component 2 of the display output component 1 is only required to satisfy the display requirement of the display output component 1. The protection component 5 of the image acquisition device is a component for protecting the target component 3 (image acquisition device, e.g., camera), and the coating film of the protection component 5 of the image acquisition device is adjusted according to the image acquisition requirement of the target component 3. That is, the coating film of the protection component 5 of the image acquisition device only needs to meet the image acquisition requirement of the target component 3. Accordingly, the display requirement of the display output component 1 and the image acquisition requirement of the target component 3 may both be satisfied at the same time.

In the present specification, each embodiment is described in a progressive manner, and each embodiment is described from a different perspective, and identical and similar parts between the embodiments can be crossed referenced to each other.

The above description of the disclosed embodiments is provided to enable any person skilled in the art to make or use the present application. Various modifications to these embodiments will be readily apparent to those skilled in the art, and the principles defined herein may be applied to other embodiments without departing from the spirit or scope of the application. Thus, the present application is not intended to be limited to the embodiments shown herein but is to be accorded the broad scope consistent with the principles and novel features disclosed herein.

What is claimed is:

1. An electronic device, comprising:

a display output component including a display region;

a display protection component;

a through-hole with the display output component and the display protection component arranged along a target direction of the through-hole, the through-hole being used to expose a target component along the target direction; and a third protection member being conductive and having a structural shape, the protection member being arranged in the through-hole and protecting at least one of the display output component or the target component, and the third protection member comprising:

a first part comprising an annular member and a first connecting member, the annular member being positioned at the display protection component along the target direction, one end of the first connecting member being connected with the annular member, and the other end of the first connecting member stretching into the through-hole; and a second part comprising an assembly piece and a second connecting member, the assembly piece being positioned at the display output component along the target direction, one end of the second connecting member being connected with the assembly piece, the other end of the second connecting member stretching into the through-hole, and the first connecting member being in contact with the second connecting member.

2. The electronic device of claim 1, the display output component comprising a first hole; the display protection component comprising a second hole;

the first hole corresponds to the second hole; the through-hole comprising the first hole and the second hole.

3. The electronic device of claim 1, wherein:

the first part comprises a first surface, the second part comprises a second surface, the second surface corresponding to the first surface; and a protruding structure is formed on the first surface or the second surface.

4. The electronic device of claim 1, wherein the third protection member is configured to change a stress direction and protect at least one of the display output component or the target component.

5. The electronic device of claim 4 wherein:

the annular member and the assembly piece limit the display output component and the protection component along the target direction.

6. The electronic device of claim 1, further comprising:

an image acquisition device being arranged in the through-hole.

7. The electronic device of claim 6, wherein the display protection component has a first protective coating film, and the image acquisition device has a second protective coating film.

8. The electronic device of claim 7, wherein the first protective coating film is different from the second protective coating film.

9. The electronic device of claim 1, wherein a projection of the display protection component and a projection of the display output component along a direction perpendicular to the target direction are located within the third protection member.

* * * * *